United States Patent
Lee et al.

(10) Patent No.: US 7,192,645 B2
(45) Date of Patent: Mar. 20, 2007

(54) POROUS LOW E (<2.0) THIN FILMS BY TRANSPORT CO-POLYMERIZATION

(75) Inventors: Chung J. Lee, Fremont, CA (US); Atul Kumar, Fremont, CA (US)

(73) Assignee: Dielectric Systems, Inc., Fremont, CA (US)

(*) Notice: Subject to any disclaimer, the term of this patent is extended or adjusted under 35 U.S.C. 154(b) by 266 days.

(21) Appl. No.: 10/207,652

(22) Filed: Jul. 29, 2002

(65) Prior Publication Data

US 2003/0072947 A1 Apr. 17, 2003

Related U.S. Application Data

(63) Continuation-in-part of application No. 10/126,919, filed on Apr. 19, 2002, now abandoned, which is a continuation-in-part of application No. 10/125,626, filed on Apr. 18, 2002, which is a continuation-in-part of application No. 10/115,879, filed on Apr. 4, 2002, which is a continuation-in-part of application No. 10/116,724, filed on Apr. 4, 2002, which is a continuation-in-part of application No. 10/029,373, filed on Dec. 20, 2001, which is a continuation-in-part of application No. 10/028,198, filed on Dec. 20, 2001, which is a continuation-in-part of application No. 09/925,712, filed on Aug. 9, 2001, now Pat. No. 6,703,462, which is a continuation-in-part of application No. 09/795,217, filed on Feb. 26, 2001.

(51) Int. Cl.
*B32B 27/28* (2006.01)

(52) U.S. Cl. ............ 428/411.1; 428/421; 428/500

(58) Field of Classification Search ......... 428/411.1, 428/500, 421; 526/75, 242, 251, 347, 348.1, 526/252, 253
See application file for complete search history.

(56) References Cited

U.S. PATENT DOCUMENTS

| | | | |
|---|---|---|---|
| 3,268,599 A | 8/1966 | Chow | |
| 3,274,267 A | 9/1966 | Chow | |
| 3,280,202 A | 10/1966 | Gilch | |
| 3,288,728 A | 11/1966 | Gorham | |
| 3,332,891 A | 7/1967 | Chow et al. | |
| 3,342,754 A | 9/1967 | Gorham et al. | |
| 3,349,045 A | 10/1967 | Gilch | |
| 3,379,803 A | 4/1968 | Tittmann et al. | |
| 3,503,903 A | 3/1970 | Shaw et al. | |
| 3,509,075 A | 4/1970 | Niegish et al. | |
| 3,626,032 A | 12/1971 | Norris | |
| 3,694,495 A | 9/1972 | Norris | |
| 3,940,530 A | 2/1976 | Loeb et al. | |
| 5,268,202 A | 12/1993 | You et al. | |
| 5,538,758 A | 7/1996 | Beach et al. | |
| 5,828,132 A * | 10/1998 | Eissa ............ | 257/759 |
| 5,879,808 A | 3/1999 | Wary et al. | |
| 5,958,510 A | 9/1999 | Sivaramakrishnam et al. | |
| 6,077,792 A * | 6/2000 | Farrar ............ | 438/780 |
| 6,130,171 A | 10/2000 | Gomi | |
| 6,140,456 A | 10/2000 | Lee et al. | |
| 6,265,320 B1 | 7/2001 | Shi et al. | |
| 6,323,297 B1 * | 11/2001 | Lee et al. ........ | 526/251 |

FOREIGN PATENT DOCUMENTS

| | | | |
|---|---|---|---|
| EP | 0 349 032 A2 | | 1/1990 |
| EP | 0 523 479 A2 | | 1/1993 |
| EP | 0 856 503 | | 8/1998 |
| EP | 0 856 503 A1 | | 8/1998 |
| EP | 1018527 A2 * | | 7/2000 |

(Continued)

OTHER PUBLICATIONS

U.S. Appl. No. 09/925,712, filed Aug. 9, 2001, Lee.
U.S. Appl. No. 10/028,198, filed Dec. 19, 2002, Lee.
U.S. Appl. No. 10/029,373, filed Dec. 19, 2002, Lee.
U.S. Appl. No. 10/115,879, filed Apr. 4, 2002, Lee.
U.S. Appl. No. 10/116,724, filed Apr. 4, 2002, Lee.

(Continued)

*Primary Examiner*—Ramsey Zacharia
(74) *Attorney, Agent, or Firm*—Alleman Hall McCoy Russell & Tuttle LLP

(57) ABSTRACT

Methods and products of Transport co-polymerization ("TCP") that are useful for preparations of low Dielectric Constant ("$\epsilon$") thin films are disclosed. Transport co-polymerization ("TCP") of reactive intermediates that are generated from a first precursor with a general structural formula $(Z)_m$—Ar—$(CX'X''Y)_n$ (VI) with a second reactive intermediate that is generated from a cage compound (e.g. Fullerenes, Methylsilsesquioxane, Hydrosilsesquioxane, and Adamantanyl) or a cyclic-compounds (e.g. Cyclo-Siloxanes and 2,2-Paracyclophanes) results in co-polymer films that are useful for making porous low $\epsilon$ ($\leq$2.0) thin films. The porous thin films of this invention consist of nano-pores with uniform pore distribution thus retain high rigidity thus are suitable for manufacturing of future ICs using copper as conductor. Preparation methods and stabilization processes for low k co-polymers that consist of $sp^2C$—Z and $HC\text{-}sp^3C_\alpha$—X bonds are also revealed. A preparation method is achieved by controlling the substrate temperature and feed rate of the major precursors. One stabilization process includes a post annealing of as-deposited co-polymer films under the presence of hydrogen under high temperatures. The reductive annealing of these films is conducted at temperatures from $-20°$ C. to $-50°$ C. to $+20°$ C. to $+50°$ C. of their Reversible Crystal Transformation ("CRT") temperatures, then quenching the resulting films to $-20°$ C. to $-50°$ C. below their "CRT" temperatures. The reductive annealing is conducted before the as-deposited film was removed from a deposition system and still under the vacuum. "Re-stabilization" processes of co-polymer surfaces that are exposed to reactive plasma etching are also disclosed; thus, further coating by barrier metal, cap layer or etch-stop layer can be safely applied.

11 Claims, No Drawings

FOREIGN PATENT DOCUMENTS

| | | |
|---|---|---|
| GB | 650 947 | 3/1951 |
| GB | 673 651 | 6/1952 |
| WO | WO-97/15699 | 5/1997 |
| WO | WO 97/15699 | 5/1997 |
| WO | WO-97/15951 | 5/1997 |
| WO | WO 97/42356 | 11/1997 |
| WO | WO-99/21705 | 5/1999 |
| WO | WO-99/21706 | 5/1999 |
| WO | WO-99/21924 | 5/1999 |
| WO | WO 99/22043 | 5/1999 |

OTHER PUBLICATIONS

U.S. Appl. No. 10/125,626, filed Apr. 17, 2002, Lee.

U.S. Appl. No. 10/126,919, filed Apr. 19, 2002, Lee.

U.S. Appl. No. 10/141,358, filed May 8, 2002, Lee.

Riedel, W., "Electro-less Nickel Plating 2nd Edition", ASM International, Finishing Publication Ltd. 1998.

Rashed, A.H., "Properties and characteristics of Silicon Carbide." a website publication (www.poco.com), POCO Graphite Inc. 300 old Greenwood Rd., Decatur, TX 76234. 2002.

Chow, S. W., et al., "Poly ($\alpha,\alpha,\alpha',\alpha'$-tetrafluoro-p-xylylene)," Journal of Applied Polymer Science, New York, NY< US, vol. 13, No. 9, 1969, pp. 2325-2332.

Greiner, A, "Poly(1,4-xylylene)s: Polymer Films by Chemical Vapour Deposition," Trends in Polymer Science, Elsevier Science Publishers B. V. Amsterdam, NL, vol. 5, No. 1, 1997, pp. 12-16.

Lang, C-I, "Vapor Deposition of Very low k Polymer Films, Poly (Naphthalene), Poly (Fluorinated Naphthalene)" Materials Research Society Symposium Proceedings, Materials Research Society, Pittsburgh, PA US, vol. 381, Apr. 17, 1995, pp. 45-50.

Sharma, A. K., et al., "Optimizing Poly(chloro-p-Xylylene) or Parylene C Synthesis," Journal of Applied Science, John Wiley and Sons, Inc., New York, US, vol. 36, No. 7, Sep. 20, 1988, pp. 1555-1565.

Yang, G. -R., et al., "High Deposition Rate Parylene Films," Journal of Crystal Growth, North-Holland Publishing Co., Amsterdam, NL, vol. 183, No. 3, 1998, pp. 385-390.

Morgen, M., et al., "Morphological Transitions in Fluorinated and Non-Fluorinated Parylenes," Materials Research Society Symposium Proceedings, vol. 565, 1999, pp. 297-302.

Harrus, A. S., et al., "Parylene Af-4: A Low $\epsilon_R$ Material Candidate for ULSI Multilevel Interconnect Applications," Material Research Society Symposium Proceedings, vol. 443, 1997.

Ryan, E. T., et al., "Effect of Deposition and Annealing on the Thermomechanical Properties of Parylene Films," Material Research Society Symposium Proceedings, vol. 476, 1997, pp. 225-230.

Plano, M. A., et al., "The Effect of Deposition Conditions on the Properties of Vapor-Deposited Parylene AF-4 Films," Material Research Society Symposium Proceedings, vol. 476, 1997, pp. 213-218.

Mathur, D., et al., "Vapor Deposition of Parylene-F Using Hydrogen as Carrier Gas," Journal of Materials Research, vol. 14, No. 1, 1999, pp. 246-250.

Lee, C, "Transport Polymerization of Gaseous Intermediates and Polymer Crystals Growth", J. Macromol. Sci-Rev. Macromol. Chem., C16 (1), 79-127 (1977-78), pp. 79-127).

Wary J, et al., Polymer Developed to be Interlayer Dielectric, Semi-Conductor International, 211-216, Jun. 1996.

Zou P., and McGivern, Sean., "Quantum Yields and Energy Partitioning in the UV Photodissociation of Halon 2402)",Jour. of Chem.Phys. vol. 113, No. 17, p. 7149-7157 (2000).

Brun A.E. 100nm: The Undiscovered Country, Semiconductor International, p. 79, Feb. 2000.

Wunderlich B. Macromolecular Physics vol. 2 "The Crystal Morphology" Academic Press, New York Company, p. 178-217 (1976).

Lee C. J. "Polyimides, polyquinolines and polyquinoxalines: Tg-Structure Relationships" Macromol. Chem. Phys. C29(4) 431-560 (1989).

Iwamoto, R., et al., "Crystal Structure of Poly-p-xylylene. I. The $\alpha$ Form," Jour. Polymer. Sci. Polymer. Phys. Ed., vol. 11, (1973), pp. 2403-2411.

Iwamoto, R., et al., "Crystallization During Polymerization of Poly-p-xylene. III. Crystal Structure and Molecular Orientation as a Function of Temperature," Jour. Polymer. Sci. Polymer. Phys. Ed., vol. 13, (1975), pp. 1925-1938.

Chow, S. W., et al., "The synthesis of 1,1,2,2,9,9,10,10-octafluorou2, 2Paracyclophane" Journal of Organic Chemistry, American Chemical Society. Easton, US vol. 35(1), 1970 pp. 20-22.

* cited by examiner

POROUS LOW E (<2.0) THIN FILMS BY TRANSPORT CO-POLYMERIZATION

RELATED APPLICATIONS

This application is a continuation-in-part of the Lee, et al., U.S. patent application, Ser. No. 10/126,919, entitled "Process Modules for Transport Polymerization of Low & Thin Films," and filed on Apr. 19, 2002 now abandoned. The Ser. No. 10/126,919 application is a continuation-in-part of the Lee, et al., U.S. patent application, Ser. No. 10/125,626, entitled "Multi-Stage-Heating Thermal Reactor for Transport Polymerization," and filed on Apr. 18, 2002. The Ser. No. 10/125,626 application is a continuation-in-part of the Lee, et al., U.S. patent application, Ser. No. 10/115,879, entitled "UV Reactor for Transport Polymerization," and filed on Apr. 4, 2002 now abandoned. The Ser. No. 10/115,879 application is a continuation-in-part of the Lee, et al., U.S. patent application, Ser. No. 10/116,724, entitled "Chemically and Electrically Stabilized Polymer Films," and filed on Apr. 4, 2002. The Ser. No. 10/116,724 application is a continuation-in-part of the Lee, et al., U.S. patent application, Ser. No. 10/029,373, entitled "Dielectric Thin Films from Fluorinated Benzocyclobutane Precursors," and filed on Dec. 20, 2001. The Ser. No. 10/029,373 application is a continuation-in-part of the Lee, et al., U.S. patent application, Ser. No. 10/028,198, entitled "Dielectric Thin Films from Fluorinated Precursors," and filed on Dec. 20, 2001. The Ser. No. 10/028,198 application is a continuation-in-part of the Lee, et al., U.S. patent application Ser. No. 09/925,712, entitled "Stabilized Polymer Film and its Manufacture," and filed on Aug. 9, 2001 now U.S. Pat. No. 6,703,462. The Ser. No. 09/925,712 application is a continuation-in-part of the Lee, et al., U.S. patent application Ser. No. 09/795,217, entitled "Integration of Low & Thin films and Ta into Cu Dual Damascene," and filed on Feb. 26, 2001. The entirety of each of the applications or patents listed above is hereby specifically incorporated by reference.

BACKGROUND

The present invention relates to preparation methods for making co-polymers that are useful in the manufacturing of future integrated circuits ("IC's"). The present invention relates to method of transport co-polymerization for making co-polymer films that can be converted into porous low dielectric ("$\epsilon$") ($\leq 2.0$) thin films. In addition, this invention relates to post treatment methods to stabilize the as-deposited co-polymer films and convert them into porous low $\epsilon$ ($\leq 2.0$) thin films.

During the manufacturing of IC's, multiple layers of films are deposited. Maintaining the compatibility and structural integrity of the different layers throughout the processes involved in finishing the IC is of vital importance. In addition to dielectric and conducting layers, its "barrier layer" may include metals such as Ti, Ta, W, and Co and their nitrides and suicides, such as TiN, TaN, TaSixNy, TiSixNy, WNx, CoNx and CoSi Nx. Ta is currently the most useful barrier layer material for the fabrication of future IC's that use copper as conductor. The "cap layer or etch stop layer" normally consists of dielectric materials such as SiC, SiN, SiON, silicon oxide ("SiyOx"), fluorinated silicon oxide ("FSG"), SiCOH, and SiCH. Thus, the new dielectric materials must also withstand many other manufacturing processes following their deposition onto a substrate.

Currently, there are two groups of low $\epsilon$ dielectric materials, which include a traditional inorganic group, exemplified by $SiO_2$, its fluorine doped product, exemplified by FSG and its C & H doped products, $SiO_xC_yH_z$, exemplified by Black Diamond and Coral respectively from Applied Materials Inc. and Novellus Inc. and newer organic polymers, exemplified by SiLK, from Dow Chemical Company. Chemical Vapor Deposition ("CVD") and spin-on coating method have been used to deposit, respectively, the inorganic and polymer dielectric films. These current dielectric materials used in the manufacturing of the ICs have already proven to be inadequate in several ways for their continued use in mass production of the future IC's. For example, these materials have high dielectric constants ($\epsilon \geq 2.7$), they have low yield (<5–7%) and marginal rigidity (Young's Modulus less than 4 GPa). In light of the shortcomings of current dielectric materials, a director of a major dielectric supplier has suggested that the use of thin films with high dielectric constants (e.g. $\epsilon = 3.5$) will be extended to the current 130 nm devices (A. E. Brun, "100 nm: The Undiscovered Country", *Semiconductor International*, February 2000, p79). This statement suggests that the current dielectric thin films are at least four years behind the Semiconductor Industrial Association's ("SIA") road map. The present lack of qualified low dielectric materials now threatens to derail the continued shrinkage of future IC's.

Currently, all conventional CVD processes have failed to make useful $\epsilon < 2.7$, Ta-compatible thin films. Due to many unique advantages that will be revealed in the following sections, we believe that TP soon will emerge as a primary CVD approach for fabrications of future IC's. Some of the important chemistries and mechanisms involved during TP has been reviewed previously (Chung Lee, "Transport Polymerization of Gaseous Intermediates and Polymer Crystals Growth" *J. Macromol. Sci-Rev. Macromol. Chem.*, C16 (1), 79–127 (1977–78), pp79–127, and is hereby incorporated by reference).

Conventional CVD Processes: There are several fundamental differences between the TP and conventional CVD processes. First, in all traditional CVD processes, starting chemicals are introduced into a CVD chamber where the "feed chemicals" are subjected to needed energy sources such as plasma or ozone to generate reacting intermediates. Film will grow when these intermediates impinge onto a substrate such as a wafer. Second, in these CVD processes, wafer is normally heated and a CVD chamber is normally operated under sub-atmosphere pressure or moderate vacuum in the ranges of few mTorrs to few Torrs. Third, in these CVD processes, film not only grows on wafer but also on chamber wall. Fourth, conventional CVD processes using ozone oxidative processes are not suitable for making organic thin films. Fifth, current CVD dielectrics that are prepared from plasma polymerization of Organo-Siloxanes have $\epsilon$ of about 2.7 or higher.

Plasma polymerization of organic precursors can provide $\epsilon$ of lower than 2.7, however, they inherit many drawbacks, which include:

1. Due to poorly selective cracking of chemical bonds by plasma, some feed chemicals can end up with several reactive sites but others still have none during plasma polymerization. To avoid this disparity by increasing power levels for instance, films with highly cross-linked density and high residual stress would result.

2. During plasma polymerization, free radicals, anions, and ions with various reactive sites on each intermediate will be generated. Since intermediates with different molecular orbital configurations likely will not react with each other, some of these intermediates will have no chance to react and become a part of the resulting network. Due to this inherent complexity, plasma polymerization commonly results in poor yield (few percent) and films with different chemical structures at molecular levels.

3. Since all kinds of reactive intermediates, including very corrosive fluorine ion or radical could be generated, it is also desirable to heat the substrate, so condensation of low molecular weight products, corrosive species and not reacted impurities can be avoided. However, with presence of corrosive species such as fluorine ion, corrosion of underlying metal such as a barrier metal on wafer can become a serious problem when wafer is kept at high temperatures.

4. In addition, when more than 15 to 20 molar % of multi-functional intermediates consisting of more than two reactive sites are present inside chamber, most of these reactive sites will be trapped inside the polymer networks or become chain ends. Post annealing is done under controlled reductive or hydrogen atmosphere before the film is removed from vacuum chamber. This is needed to eliminate these reactive chain ends in order to avoid later reactions of these reactive chain ends with undesirable chemicals such as water or oxygen.

5. Finally, presence of many polymer chain-ends and pending short chains in polymer networks will result in high dielectric loss, thus the resulting dielectric will not be useful for high frequency (GHz) applications that are critical to most future IC applications. For the reasons listed above, all conventional CVD processes have failed to make useful $\epsilon < 2.7$, Ta-compatible thin films.

The State of Transport Polymerization: Transport polymerization ("TP") employs known chemical processes to generate desirable reactive intermediates among other chemical species. Chemical processes that are particularly useful for this invention include photolysis and thermolysis. These two chemical processes can generate useful reactive intermediates such as carbenes, benzynes and other types of diradicals using appropriate precursors.

Photolysis can be accomplished by irradiation of compounds using electrons, UV or X-ray. However, high energetic electron and X-ray sources are expensive and typically not practical for reactors useful for this invention. When a UV photolytic process is used, a precursor that bears special leaving groups is normally required. For example, reactive intermediates such as carbenes and diradicals can be generated by the UV photolysis of precursors that bear ketene or diazo-groups. However, these types of precursors normally are expensive and not practical to use due to their very unstable nature at ambient temperatures. Other precursors and chemistry have been used for generating reactive intermediates and discussed in prior art (C. J. Lee, "Transport Polymerization of Gaseous Intermediates and Polymer Crystals Growth" *J. Macromol. Sci-Rev. Macromol. Chem.*, C16 (1), 79–127 (1977–78), pp79–127). However, most of these precursors are quite expensive to prepare and are not readily available, thus they are not desirable nor practical for IC fabrications outlined in the current invention. A specially designed UV Reactor is used for Transport Polymerization and thin film preparation of some thermally stable precursors, and was described in a co-pending U.S. patent application Ser. No. 10/115,879 filed in Apr. 4, 2002, and entitled "UV Reactor for Transport polymerization" with Lee, et al. listed as inventors. This co-pending application is hereby incorporated by reference.

Thermolysis has been used for TP of Poly(Para-Xylylenes) ("PPX") for the coating of circuit boards and other electronic components since early 1970s. Currently, all commercial PPX films are prepared by the Gorham method (Gorham, et al., U.S. Pat. No. 3,342,754, the content of which is hereby incorporated by reference). The Gorham method employed dimer precursor (I) that cracks under high temperatures (e.g. 600 to 680° C.) to generate a reactive and gaseous diradical (II) under vacuum. When adsorbed onto cold solid surfaces, the diradical (II) polymerizes to form a polymer film (III).

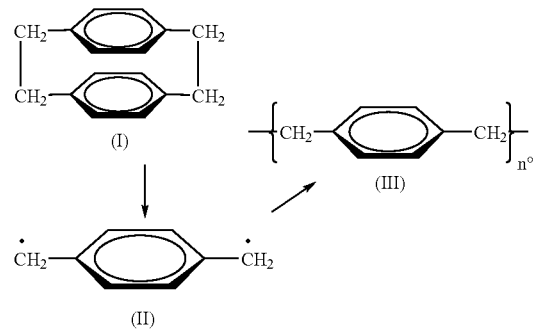

Since 1970, several commercialized products have appeared on the market with similar chemical structures. For example, a polymer PPX-D $\{-CH_2-C_6H_2Cl_2-CH_2-\}$ had a dielectric constants, $\epsilon$ of 3.2. However, all these polymers were not thermally stable at temperatures higher than 300 to 350° C., and were not useful for fabrications of future ICs that require dielectric with lower $\epsilon$ and better thermal stability. On the other hand, the PPX-F, $-(CF_2-C_6H_4-CF_2-)_N$ has a $\epsilon=2.23$ and is thermally stable up to 450° C. over 2.5 hours in vacuum. Therefore, rigorous attempts have been made to make PPX-F from dimer $(-CF_2-C_6H_4-CF_2-)_2$ (Wary et al, Proceedings, 2nd Intl. *DUMIC*, 1996 pp207–213; ibid, *Semiconductor Int'l*, 19(6), 1996, p211–216) using commercially available equipment. However, these efforts were abandoned due to high cost of the dimer and incompatibility of the barrier metal (e.g. Ta) with PPX-F films prepared by TP (Lu et al, *J.Mater.Res.Vol*,14(1), p246–250, 1999; Plano et al, *MRS Symp.Proc.Vol*.476, p213–218, 1998—these cited articles are herby incorporated by reference.)

U.S. Pat. No. 5,268,202 with Moore listed as inventor ("the Moore '202 patent"), teaches that a dibromo-monomer (e.g. IV=$\{Br-CF_2-C_6Cl_4-CF_2-Br\}$) and a metallic "catalyst" (Cu or Zn) inside a stainless steel pyrolyzer can be used to generate reactive free radical (V) according to the reaction (3). However, to lower the cost of starting materials, a large proportion (>85 to 95 molar %) of a more readily available co-monomer with structure $\{CF_3-C_6H_4-CF_3\}$ has also been used to make PPX-F.

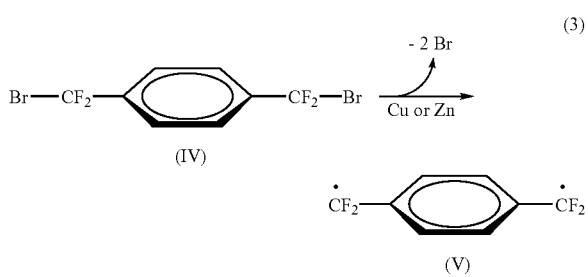

There are several key points that need to be addressed concerning the usage of the monomer (IV) in reaction (3). First, an earlier U.S. Pat. No. 3,268,599 ("the Chow '599 patent") with Chow listed as inventor, revealed the chemistry to prepare a dimmer as early as 1966. However, the Chow '599 patent only taught the method to prepared dimer $\{CF_2—C_6H_4—CF_2\}_2$ by trapping the diradical (V) in a solvent. Furthermore, the equipment and processing methods of the Chow '599 patent employed were not suitable for making thin films that are useful for IC fabrications. Second, according to the Moore '202 patent, the above reaction (3) would need a cracking temperature ranging from 660–680° C., without using the "catalysts". However, we found that metallic "catalysts" such as Zn or Cu would readily react with organic bromine at temperatures ranging from 300 to 450° C., the pyrolyzer temperatures employed by the Moore '202 patent. Formation of metallic halides on surfaces of these "catalysts" would quickly deactivate these "catalysts" and inhibit further de-bromination shown in reaction (3). In addition, the presence of Zn and Cu halides inside a pyrolyzer would likely cause contamination for the process module and dielectric films on wafer. Third, cooling of reactive intermediate and wafer cooling could not be efficient because both the wafer holder and pyrolyzer were located inside a close system for the deposition chamber that was used in the Moore '202 patent. Consequently, the process module used by the Moore '202 patent cannot be useful for preparation of thin films of this invention.

Transport polymerization ("TP") methods and processes for making low dielectric polymers that consist of $sp^2C$—X and $HC-sp^3C_\alpha$—X bonds were described in a co-pending U.S. application Ser. No. 09/795,217 that was filed on Feb. 26, 2001, and entitled "Integration of Low $\epsilon$ thin films and Ta into Cu Dual Damascene," with Lee, et al., listed as inventors. Wherein, X is H or preferably F for achieving better thermal stability and lower dielectric constant of the resulting polymers. $HC-sp^3C_\alpha$—X is designated for a hyper-conjugated $sp^3C$—X bond or for a single bond of X to a carbon atom that is bonded directly to an aromatic moiety. Due to hyper-conjugation (see p275, T. A. Geissman, "Principles of Organic Chemistry", 3rd edition, W. H. Freeman & Company), this C—X (X=H or F) has some double-double bond character, thus they are thermally stable for fabrications of future ICs.

However, we have observed that after Transport Polymerization, an as-deposited thin film may not achieve its best dimensional stability. Therefore, deposition conditions and post treatment methods to achieve high dimensional stability from the as-deposited films are described in a co-pending U.S. patet application Ser. No. 09/925,712, that was filed on Aug. 9, 2001 and entitled "Stabilized Polymer Film and its Manufacture," with Lee, et al., listed as inventors. Methods to optimize the chemical stability thus achieving best electrical performance for an as-deposited film have been outlined in another co-pending application, U.S. patent application Ser. No. 10/116,724; filed on Apr. 4, 2002. In addition, after reactive plasma etching of a dimensionally and chemically stabilized film, the surface chemical composition of the resulting film has changed. Due to degradation of surface composition under reactive conditions, loss of adhesion between dielectric film and barrier metal, cap layer or etch-stop layer can occur. The invention reported herein describes processing conditions to provide good chemical stability thus interfacial adhesion between the dielectric film and the subsequently deposited top layer such as the barrier metal, the cap layer or etch-stop layer.

SUMMARY

A primary object of this invention is to provide methods for making porous thin films that are suitable for manufacturing of future ICs using copper as conductor. This invention also provides methods for making co-polymer films that can be converted into porous low $\epsilon$ (<2.0) thin films, and the films will contain a uniform distribution of nano-pores. Additionally, the low k, co-polymers that consist of $sp^2C$—Z and $HC-sp^3C_\alpha$—X bonds (Z and X=H or F) and are suitable for fabrication of IC's using the Cu Dual Damascene process, and are compatible with barrier layer materials following after reactive plasma etching. After reactive plasma etching the low k co-polymers are compatible with cap layer or/and etch stop materials, are thermally stable at the high temperatures, and have good adhesion to the barrier metal, the cap layer or etch-stop layer. Another object is to provide processing methods for achieving both chemical and electrical stability of a co-polymer film obtained from transport co-polymerization, and to provide a dry etching method by reductive plasma, therefore to avoiding a need for a post reductive annealing process after plasma patterning of the co-polymer films of this invention.

One aspect of the current invention involves a co-polymer dielectric thin film prepared by transport co-polymerization ("TCP") of a first reactive intermediate with a second reactive intermediate. The first reactive intermediate is formed from a first co-precursor, and wherein a second reactive intermediate is formed from a second co-precursor. The general structural formulas of the first and second precursors are given in formula's (VI) and (VII). The current invention also involves a reactive intermediates of the first and second reactive intermediate, as shown in formula's (XV), and (XVI). A preferred embodiment of the current invention involves a co-polymer dielectric thin film that comprises a co-Poly(Para-Xylylene) ("co-PPX") having formula (XVII), wherein Z is the same or different and individually is H or F; Z' is the same or different and individually is H or F; X' is the same or different and individually is H or F; X, is the same or different and individually is H or F; and at least one X is H; a is an integer from 1 to 10; b is an integer from 10 to 50; $n^{\infty\infty}$ is an integer of at least 5; n and n' are integers. Additionally the current invention involves the aromatic or the fluorinated-aromatic group moiety of formula (VI) or (VII) are selected from the group consisting of $C_6H_{4-n}F_n$ (n=0 to 4), $C_{10}H_{6-n}F_n$ (n=0 to 6), $C_{12}H_{8-n}F_n$ (n=0 to 8), $C_{14}H_{8-n}F_n$ (n=0 to 8), $C_{16}H_{8-n}F_n$ (n=0 to 8), and $C_{16}H_{10-n}F_n$ (n=0 to 10).

Another aspect of the current invention involves related properties of the co-polymer dielectric thin film (e.g. a melting temperature, a reversible crystal transformation temperature, an irreversible crystal transformation temperature, and a glass transition temperature). For example, the melting temperature of the co-polymer dielectric thin film is greater than the reversible crystal transformation temperature, the reversible crystal transformation temperature is greater than the irreversible crystal transformation temperature, and the irreversible crystal transformation temperature is greater than the glass transition temperature. It has also been contemplated by the inventors that a preferred co-polymer dielectric thin film comprises a co-Poly(Para-Xylylene) ("Co-PPX") having repeating-units selected from the group consisting of $((—CH_2—C_6H_4—H_2C—)_a(—CF_2—C_6H_4—F_2C—)_b)_{n^{\infty}}$, $((—CF_2—C_6F_4—F_2C—)_a —(CH_2—C_6F_4—H_2C—)_b)_{n^{\infty}}$, $((—CF_2—C_6H_2F_2—F_2C—)_a(—CF_2—C_6F_4—H_2C—)_b)_{n^{\infty}}$, wherein, "a" is an integer that ranges from 3 to 10; "b" is an integer that ranges from 20 to 100;

and $n^{oo}$ is an integer of at least 10. Additionally, a major composition of the co-PPX is a PPX-F and its derivatives, having a major repeating unit comprising ($-CF_2-C_6Z_4-F_2C-$), wherein Z is H or F have been contemplated. In preferred embodiments, the PPX-F content ranges from 65 to 95%. However, a minor composition of the co-PPX is a PPX-N and its derivatives has been contemplated to have a minor repeating unit comprising ($-CH_2-C_6Z_4-H_2C-$), wherein Z is H or F. The co-polymer dielectric thin film of this invention may be transparent and semicrystalline.

Still another aspect of the current invention involves methods for preparing a co-polymer dielectric thin film on a substrate for fabricating integrated circuits ("IC"), comprising the step of co-polymerizing intermediates from a first co-precursor and second co-precursors, of formula (VI) and (VII), respectively. The method involves co-polymerization when the substrate temperature is below −30° C., and the feed rate for the first reactive intermediate and the second reactive intermediate of transport co-polymerization is below 0.2 mMol/minute for a 200 mm wafer.

Yet another aspect of the current invention involves a method for stabilizing an as-deposited co-polymer dielectric thin film by a regimen of heating, and cooling the as deposited co-polymer thin film. For example, heating the as-deposited co-polymer dielectric thin film was conducted under a vacuum, in a reductive atmosphere, or both. The resultant heated-as-deposited dielectric thin film was then maintained at an isothermal temperature for a period of time (e.g. about 1 to 120 minutes) to give an isothermal-heated-as-deposited co-polymer dielectric thin film. By cooling the isothermal-heated-as-deposited co-polymer dielectric thin film to a cooling-temperature, a stabilized-as-deposited thin film was formed. It is important to keep in mind that the as-deposited co-polymer dielectric thin film has important related properties (e.g. a melting temperature, a reversible crystal transformation temperature, an irreversible crystal transformation temperature, and a glass transition temperature), wherein the melting temperature is greater than the reversible crystal transformation temperature, the reversible crystal transformation temperature is greater than the irreversible crystal transformation temperature, and the irreversible crystal transformation temperature is greater than the glass transition temperature. Such temperatures are useful for employing the method because heating of the as-deposited co-polymer dielectric thin film occurs at a temperature between 20° to 50° C. below the reversible crystal transformation temperature and 20° to 50° C. below the melting temperature. Additionally, cooling of the isothermal-heated-as-deposited co-polymer dielectric thin film occurs at a rate of about 30° to 100° C. per minute to a temperature that is about 20° to 50° C. below the reversible crystal transformation temperature. The reductive atmosphere used to stabilize the co-polymer film comprises hydrogen in a noble gas. In a specific embodiment, the presence of hydrogen in the noble gas comprises at least 0.1% volume of hydrogen in a argon. Other examples utilize the presence of hydrogen in the noble gas that comprises at least 3% volume of hydrogen in a argon. Additionally, the reductive-annealing step is typically conducted before removing the stabilized-as-deposited co-polymer dielectric thin film from a deposition system.

Another aspect of the current invention involves a method of re-stabilizing an as-deposited etched-co-polymer dielectric thin film that was subjected to a reactive-plasma-etching-process. The re-stabilizing method comprises treating the etched-co-polymer dielectric thin film under an atmosphere with a non-oxidative plasma to form a treated-etched-dielectric thin film, and then annealing the treated-etched-co-polymer dielectric thin film under a reducing atmosphere at a temperature in the range between −50 to +50° C. of a reversible crystal transformation temperature to form a reduced-etched-dielectric thin film. The film is then maintained at an isothermal temperature for a predetermined period of time, and then cooled until the surface to temperatures are at least 20 to 50° C. below a reversible crystal transformation temperature of the co-polymer film. However, it is recommended that the reactive-plasma-etching-process occurred under a reactive-atmosphere comprising nitrogen or oxygen. Furthermore, the non-reactive plasma should occur in the presence of a noble gas (e.g. argon), at a discharge power of about 10 to 100 Watts for a time period between 2 to 50 minutes. In general, the reductive annealing is performed in the presence of a reductive gas sufficient to reduce an oxygenated $sp^2C$ and $HC$-$sp^3C$ bonds to $sp^2C$—Z and $HC$-$sp^3C_\alpha$—X, wherein Z and X is H or F. The reductive gas may comprise 1 to 10% hydrogen in argon; or 1 to 10% fluorine in argon.

In another aspect of the current invention, a method for building a Damascene structure on the stabilized or re-stabilized co-polymer dielectric thin film is described. The method includes patterning a via in the stabilized-as-deposited co-polymer film by reactive-plasma etching to give an etched-stabilized-as-deposited-co-polymer dielectric thin film; cleaning the etched-stabilized-as-deposited-co-polymer dielectric thin film with a wet chemical to give a clean-etched-stabilized-co-polymer dielectric thin film; roughening a surface of the clean-etched-stabilized co-polymer dielectric thin film with a non-reactive plasma to form a rough-etched-as-deposited-co-polymer dielectric thin film useful for further coating; and reductive-annealing the rough-etched-as-deposited-co-polymer dielectric thin film under a reducing atmosphere at a temperature in a range between −50 to +50° C. of a reversible crystal transformation temperature to give the Damascene structure on the stabilized, or re-stabilized-as-deposited co-polymer dielectric thin film. The reactive-plasma-etching-process of this method occurs under a reactive-atmosphere comprising nitrogen or oxygen. Additionally the treatment of the etched-stabilized co-polymer dielectric thin film to the non-reactive plasma occurs in the presence of a noble gas (e.g. argon), under 20 to 2000 mTorrs of pressure a discharge power of about 0.1 to 1.0 W/cm² for a time period between 2 to 50 minutes. In general, the reductive annealing is performed in the presence of a reductive gas sufficient to reduce an oxygenated $sp^2C$ and $HC$-$sp^3C$ bonds to $sp^2$ C—Z and $HC$-$sp^3C_\alpha$—X, wherein Z and X is H or F. The reductive gas may comprise 1 to 10% hydrogen in argon; or 1 to 10% fluorine in argon.

DETAILED DESCRIPTION OF THE PREFERRED EMBODIMENTS

Broadly, the present invention pertains to processing method of co-polymers that consist of $sp^2C$—Z and $HC$-$sp^3C$—X bonds (Z and X=H or F) for fabrications of future IC's. The present invention also pertains to processing methods of co-polymers that consist of $sp^2C$—Z and $HC$-$sp^3C_\alpha$—X bonds (Z and X=H or F) and exhibit at least an irreversible crystal transformation temperature ("$T_1$"), a reversible crystal transformation temperature ("$T_2$") and a crystal melting temperature, ("$T_m$"). The present invention furthermore pertains to annealing methods to stabilize an as-deposited film that prepared from Transport Polymerization. The present invention, in addition, pertains to annealing methods to stabilize the co-polymer after a reactive plasma etching. Furthermore, the present invention pertains to employment of reductive plasma conditions for patterning a co-polymer that consist of $sp^2C$—Z and $HC-sp^3C_\alpha$—X bonds (Z and X=H or F). Furthermore, the present invention pertains to employment of inert or reductive annealing conditions for generating nanopores inside co-polymer thin films that consist of $sp^2C$—Z and $HC-sp^3C_\alpha$—X bonds (Z and X=H or F).

I. General Chemical Aspects of this inventions: The co-polymer of this invention is preferably prepared by the process of Transport Co-Polymerization of reactive intermediates. The reactive intermediates are generated from a first co-precursor and a second co-precursor, wherein the intermediates from the first- and second-co-precursors are similar or different. One aspect of the current invention utilizes a major precursor for the first co-precursor, which has a general formula as shown in structure (VI):

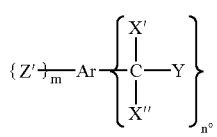

(VI)

The reactive intermediates of the second co-precursor are generated from cage compounds such as Fullerenes, Methylsilsesquioxane (("MSQ") ($H_3C$—Si—$O_2)_8$), Hydrosilsesquioxane, ("HSQ") (H—Si—$O_2)_{8-12}$,), Adamantanyl compounds, or cyclic-compounds (e.g. Cyclo-Siloxanes (($CH_3)_2$—Si—O$)_n$ under a vacuum with a low system-leakage-rate, or and inert atmosphere or both. However the preferred reactive intermediates are generated from the second co-precursor are 2,2-Paracyclophanes, with a general formula as shown in structure (VII),

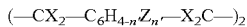

$(—CX_2—C_6H_{4-n}Z_{n'}—X_2C—)_2$ (VII)

The precursors generated from the above structure (VI) are better understood when $n^o$ or m are individually zero or an integer, and ($n^o$+m) comprises an integer of at least 2 but no more than a total number of $sp^2C$ substitution on the aromatic-group-moiety ("Ar"). X' and X" are similar or different, and individually a hydrogen, a fluorine, an alkyl group, a fluorinated alkyl group, a phenyl group or a fluorinated phenyl group. Y is a leaving group, and individually a —Cl, —Br, —I, —$NR_2$, —$N^+R_3$, —SR, —$SO_2R$, or —OR, wherein R is an alkyl, a fluorinated alkyl, aromatic or fluorinated aromatic group. Furthermore, Ar is an aromatic or a fluorinated-aromatic group moiety, wherein Z'=H or F. Additionally, the Ar is preferably a fluorinated aromatic moiety including, but not limiting to, the phenyl moiety, —$C_6H_{4-n}F_n$ (n=0 to 4) such as —$C_6H_4$— and —$C_6F_4$—; the naphthenyl moiety, —$C_{10}H_{6-n}F_n$—(n=0 to 6) such as —$C_{10}H_6$— and —$C_{10}F_6$—; the di-phenyl moiety, —$C_{12}H_{8-n}F_n$—(n=0 to 8such as —$C_6H_2F_2$—$C_6H_2F_2$— and —$C_6F_4$—$C_6H_4$—; the anthracenyl moiety, —$C_{12}H_{8-n}F_n$; the phenanthrenyl moiety, —$C_{14}H_{8-n}F_n$—; the pyrenyl moiety, —$C_{16}H_{8-n}F_n$— and more complex combinations of the phenyl and naphthenyl moieties, —$C_{16}H_{8-n}F_n$—. Isomers of various fluorine substitutions on the aromatic moieties are also included in this invention. Additionally, a preferred precursor of shown in (VI) is when Z'=H; X'=X"=F; and Y=Br or I, as shown in equation (VIII).

(VIII)

The precursors of the above equation (VII) are better understood when X is a hydrogen, a fluorine, or an alkyl group and Z is individually H or F. Additionally, a preferred precursor of equation (VII) is when Z=F or H; and X=H, as shown in equation (IX).

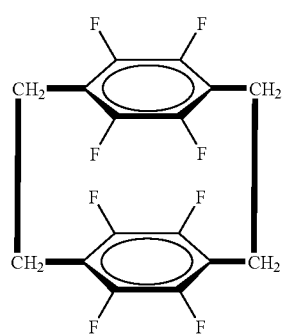

(IX)

The inert atmosphere is preferably devoid of free radical scavengers or compounds containing active hydrogen. Although not wanting to be bound by theory, the intermediate generated from the precursor (VI) has the general structures as shown in (X):

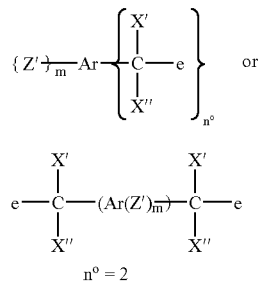

(X)

Wherein, the intermediates of the above equation (X) are better understood when $n^o$ or m are individually zero or an integer, and ($n^o$+m) comprises an integer of at least 2 but no more than a total number of $sp^2C$ substitution on the aromatic-group-moiety ("Ar"). X' and X" are similar or different, and individually a hydrogen, a fluorine, an alkyl group, a fluorinated alkyl group, a phenyl group or a fluorinated phenyl group. Furthermore, Ar is an aromatic or a fluorinated-aromatic group moiety, wherein Z'=H or F. Additionally, the Ar is preferably a fluorinated aromatic moiety including, but not limiting to, the phenyl moiety, —$C_6H_{4-n}F_n$ (n=0 to 4) such as —$C_6H_4$— and —$C_6F_4$—; the naphthenyl moiety, —$C_{10}H_{6-n}F_n$—(n=0 to 6) such as —$C_{10}H_6$— and —$C_{10}F_6$—; the di-phenyl moiety, —$C_{12}H_{8-n}F_n$—(n=0 to 8) such as —$C_6H_2$—$F_2$—$C_6H_2F_2$— and —$C_6F_4$—$C_6H_4$—; the anthracenyl moiety, —$C_{12}H_{8-n}F_n$; the phenanthrenyl moiety, —$C_{14}H_{8-n}F_n$—; the pyrenyl moiety, —$C_{16}H_{8-n}F_n$— and more complex combinations of the phenyl and naphthenyl moieties, —$C_{16}H_{10-n}F_n$—. Note that isomers of various fluorine substitutions on the aromatic moieties are also included in this invention. The "e" is a free radical having an unpaired electron. A specific example of an intermediate from equation (VIII) has the structure as shown in (XI):

Similarly, and also not wanting to be bound by theory, the intermediate generated from the precursor (VII), wherein X=H and Z=F, has the structure:

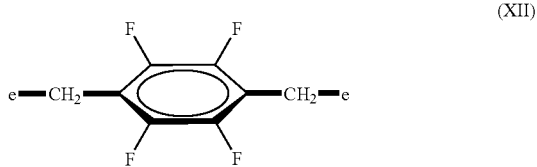

Note that these co-polymers only consist of $sp^2C-Z$ and $HC\text{-}sp^3C_\alpha-X$ bonds, wherein Z and X is H or F. $HC\text{-}sp^3C_\alpha-X$ is designated for a hyper-conjugated $sp^3C-X$ bond or for a single bond of X to a carbon that is bonded directly to an aromatic moiety. Due to hyper-conjugation, this C—X (X=H or F) has some double-double bond character, thus they are thermally stable for fabrications of future ICs.

In other specific embodiments, the aromatic of equations (VI) or (VII) comprise: $C_6H_{4-n}-F_n$ (where n=0 to 4), $C_{10}H_{6-n}-F_n$ (where n=0 to 6), $C_{12}H_{8-n}-F_n$ (where n=0 to 8), $C_{14}H_{8-n}-F_n$ (where n=0 to 8 or $C_{16}H_{8-n}-F_n$ (where n=0 to 8). In further specific embodiments, the repeat unit of a co-polymer is $((-CH_2-C_6H_4-H_2C-)_a(-CF_2-C_6H_4-F_2C-)_b)_{n''}$, $((-CF_2-C_6F_4-F_2C-)_a(-CH_2-C_6F_4-H_2C-)_b)_{n''}$, $((-CF_2-C_6H_2F_2-F_2C-)_a(-CF_2-C_6F_4-H_2C-)_b)_{n''}$, werein "a" is an integer from 1 to 15, preferably from 3 to 10, "b" is an integer from 10 to 150, preferably from 20 to 100 and n" is an integer of at least 5, preferably 10. The inert atmosphere is preferably devoid of free radical scavengers or compounds containing active hydrogen such as $H_2O$ and $NH_3$. Examples of the aromatic moiety Ar, of equation (VI), include, but are not limited to, the phenyl moiety, $C_6H_{4-n}F_n$ (n=0 to 4), including $C_6H_4$ and $C_6F_4$; the naphthenyl moiety, $C_{10}H_{6-n}F_n$ (n=0 to 6), including $C_{10}H6$ and $C_{10}F_6$; the di-phenyl moiety, $C_{12}H_8-_nF_n$ (n=0 to 8), including $C_6H_2F_2-C_6H_2F_2$ and $C_6F_4-C_6H_4$; the anthracenyl moiety, $C_{12}H_{8-n}F_n$ (n=0 to 8); the phenanthrenyl moiety, $C_{14}H_{8-n}F_n$ (n=0 to 8); the pyrenyl moiety, $C_{16}H_{8-n}F_n$ (n=0 to 8) and more complex combinations of the above moieties, including $C_{16}H_{10-n}F_n$ (n=0 to 10). Isomers of various fluorine substitutions on the aromatic moieties are also included.

In other preferred embodiments, the base vacuum is lower than 100 mTorrs, and preferably below 0.01 mTorrs, to avoid moisture inside deposition chamber. In further specific embodiments, the system leakage rate is less than about 2 mTorrs per minute, preferably less than 0.4 mTorrs/minute. In another preferred embodiment, the co-polymer film has a melting temperature ("$T_m$") greater than its reversible crystal transformation temperature ("$T_2$"), which is greater than its irreversible crystal transformation temperature ("$T_1$"), which is greater than its glass transition temperature ("$T_g$").

In another embodiment, the co-polymer is transparent and semicrystalline. In further specific embodiment, the co-polymer consists of PPX-F or its derivatives, which has a repeating unit with the structure of $(-CF_2-C_6Z_4-F_2C-)$ wherein the four Z moieties are similar or different and individually H, F or its combination, as represented in equation (XIII).

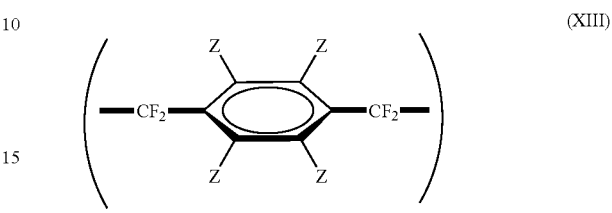

Any material with low dielectric constant should possess several important attributes to be acceptable for integration into IC's:

First, the dielectric should be compositionally and dimensionally stable. The structural integrity should remain intact throughout the fabrication processes and after integration into the IC's. These processes include reactive ion etching ("RIE") or plasma patterning, stripping of photoresist, chemical vapor or physical vapor deposition ("CVD" or "PVD") of barrier and cap materials, electroplating and annealing of copper and chemical mechanical polishing ("CMP") of the copper. In addition, to maintain its electrical integrity after the IC fabrication, the dielectric should be free from contamination by barrier materials such as Ta.

In addition, the dielectric should not cause the structural or chemical breakdown of a barrier or cap layer. No corrosive organic elements, particularly any that would cause interfacial corrosion, should diffuse into the barrier or cap material. In addition, the dielectric should have sufficient dimensional stability so that interfacial stress resulting from a Coefficient of Thermal Expansion ("CTE")-mismatch between the dielectric and barrier or cap layer would not induce structural failure during and after the manufacturing of the IC's.

Finally, the interfaces of the dielectric and barrier or cap layers should be free from moisture, preventing the occurrence of ionic formation and/or migration when the IC's are operated under electrical bias.

The co-polymers can be prepared by polymerization of their corresponding reactive diradical intermediates via transport polymerization. (Lee, J., Macromol, et al., Sci-Rev. Macromol. Chem., C16(1) (1977–78)). Examples of the co-polymers and their repeat units resulting from co-polymerization of the diradical intermediates include $((CH_2-C_6H_4-H_2C)_a(CF_2-C_6H_4-F_2C)_b)_n^\infty$, $((CF_2-C_6F_4-F_2C)_a(CH_2-C_6F_4-H_2C)_b)_n^\infty$, $((CF_2-C_6H_2F_2-CF_2)_a(CF_2-C_6F_4-H_2C)_b)_n^\infty$. Herein, "a" is an integer from 1 to 15, preferably from 3 to 10; "b" is an integer from 10 to 150, preferably from 20 to 100; $n^\infty$ is an integer of at least 5, preferably 10. In general, diradical intermediates can be prepared from pyrolysis of corresponding dimers according to the Gorham method (U.S. Pat. No. 3,342,754). The diradical intermediates can also be prepared by pyrolysis of monomers and co-monomers under vacuum conditions or an inert atmosphere (see U.S. patent application entitled "Integration of Low ϵ Thin Film and Ta Into Cu Dual Damascene," filed on Feb. 26, 2001 with Ser. No. 09/795,217 and Lee, et al., listed as inventors, the entire content of which is hereby incorporated by reference.) The vacuum should be lower than about 100 mTorrs, preferably about 30 mTorrs. The vacuum system should also have an air or system leakage rate of less than about 2 mTorrs/minute, preferably lower than 0.4 mTorrs/minute. An inert atmosphere is an atmosphere that is devoid of free radical scavengers such as water and oxygen, or devoid of a compound containing "active hydrogen," such as an —OH, —SH, or —RNH group.

The resultant co-polymers can be transparent or opaque films or in powder form depending on processing conditions. Only continuous films can be useful for IC manufacturing applications. Opaque films that contain micro-cracks or spherulites with crystal sizes even in sub-micrometer range are not useful for this invention. Transparent films can be in an amorphous or semicrystalline phase. When its crystalline phase is less than 10 nm or lower, semicrystalline films can be useful for the manufacturing of future IC's. Amorphous films consist of random co-polymer chain orientations, which will create equal interfacial stress in all directions, thus avoiding problems that are associated with semi-crystalline polymers. However, amorphous films that consist of a regular chemical structure or repeating unit in their backbone structures can be re-crystallized into semicrystalline films. For example, amorphous PPX-F containing film can transform into semicrystalline films when they are exposed to temperatures 20° to 30° C. above their glass transition temperature, ("$T_g$"). Since re-crystallization will induce dimensional change and PPX-N and PPX-F have $T_g$'s of only about 65° C. and 172° C. respectively, the amorphous or low crystalline PPX-N and PPX-F are not useful for the manufacturing of future IC's.

Transparent semicrystalline PPX-N films have been obtained by controlling primarily the substrate temperature and chemical feed rate under a particular range of vacuum pressure in a deposition chamber. Detailed conditions and general mechanisms for making transparent semicrystalline PPX-N films have been described previously (Wunderlich, et al., J. Polym. Sci. Polym. Phys. Ed., Vol. 11 (1973) and Wunderlich, et al., J. Polym. Sci. Polym. Phys. Ed., Vol. 13 (1975)). The suitable vacuum range is about 1 to about 100 mTorrs, preferably about 5 to about 25 mTorrs. Under this vacuum range, the crystal form and crystallinity are result directly from the feed rate and substrate temperature. Suitable substrate temperatures can range from about −10 to about −80° C., preferably from about −25° C. to about −45° C. During IC fabrication, cooling an electric chuck or a wafer holder using a coolant controls wafer temperature. A wafer temperature below about −45° C. is desirable for obtaining a high deposition rate, but it requires a special, expensive coolant such as fluorocarbon fluid or silicone oil.

It should be noted that at very low substrate temperatures, about −50° C. to −60° C., nucleation rates can be very high and hetero-epitaxial or highly oriented crystal growth is possible. The resulting co-polymer crystals would therefore be in "transcyrstalline" or "columnar" forms. At these low temperature ranges, diradicals are absorbed very rapidly and the film growth rates are very high. However, this is achieved at the expense of the resulting crystallinity due to the entrapment of low molecular weight PPX-F units or other defects. A PPX-F containing films with low crystallinity can have poor dimensional stability at temperatures above its $T_g$, about 172° C. The PPX-F consisting films prepared under these conditions still need to be properly annealed before they can be useful for the manufacturing of future IC's. Thin films consisting of even more than few percent of low molecular weight polymers are not useful due to the poor dimensional and chemical stability during the manufacturing of IC's.

Therefore, under the vacuum range of a few mTorrs and at substrate temperatures ranging from about −25 to about −45° C., desirable thin films with high crystallinity can be obtained by adjusting the feed rate of the precursors. Depending on the chemistries and precursors employed for the preparation, the feed rates can be very different. For example, at a feed rate from 1 to 10 standard cubic centimeters per minutes ("sccm") of the monomer Br—$CF_2$—$C_6H_4$—$CF_2$—Br and at a substrate temperature from about −30° C. to about −50° C., crystalline PPX-F containing films can be obtained. When the substrate temperature is higher than about 10° C. to 20° C., nucleation is difficult due to the low adsorption of diradical intermediates. However, under very high feed or flow rates, co-polymer crystal growth can still be possible after an induction period to overcome primary nucleation on the substrate. PPX-F containing films prepared under these conditions can have high crystallinity. Even without annealing, these PPX-F containing films can be useful for integration into future IC's. Furthermore, it is possible to prepare a high temperature crystal form of PPX-F at substrate temperatures above 40–60° C., though the deposition rate will suffer enormously.

One should note that the above deposition processes inherently resulted in an as-deposited film with both chemical and dimensional instabilities that need further explanations as described in the following paragraphs.

Chemical Instability of as-deposited Films: In general, the dielectric co-polymer film of this invention is formed in vacuum by step co-polymerization of many intermediate molecules or intermediates called diradicals. Each diradical carries an unpaired electron on both ends of the intermediate. The diradical is called an intermediate, because it is very reactive toward another diradical. Although not wanting to be bound by theory, the intermediate has a lifetime of $10^{-6}$ second or less, when colliding at solid state with another diradical, even at temperatures as low as −100° C. The reaction for polymer-chain extension is called step polymerization because the polymerization reaction is occurring one step a time.

Although not wanting to be bound by theory, each diradical can grow from both ends of the intermediate, and after each step of the reaction, because the resulting co-polymer always leaves another unpaired electron at the chain ends of the co-polymer. Thus, as co-polymer chain grows, each co-polymer-chain always bears two unpaired electrons at both ends of the co-polymer. This co-polymer chain can grow as long as there is no scavenger around or the chain-end is physically buried under other co-polymer chains that have grow over the end. A compound that consists of an X—H group (wherein X is nitrogen, sulfur or oxygen) is very effective toward neutralizing the unpaired electron, and stopping the chain growth, such compounds are called scavengers.

Since scavengers are absence under a vacuum, the resulting dielectric film consists of a living co-polymer or co-polymer chains with unpaired electrons at the co-polymer chain ends. Although the co-polymer chain ends are buried inside the films, they still reactive toward scavengers, because most scavengers have smaller molecular size and can still diffuse to these chain ends. Unfortunately, the resulting products that carry —C═O or C—X (X═O, N, S) bonds are very thermally unstable at high temperatures. These chemical groups decompose at temperatures from 250 to 400° C. in few minutes. In addition, presence of these unpaired electrons at co-polymer chain ends can result in poor electrical properties.

The above problems will pose a challenge to make chemically and electrically stable dielectric film, if the as-deposited film is exposed to air before these living chain ends are converted to some stable chemical groups. One solution for this problem is to anneal an as-deposited dielectric film with hydrogen under high temperature before the film is removed from deposition chamber or vacuum system. This annealing process can achieve both high crystallinity for better dimensional stability and chemical stability by capping all unpaired chain ends with C—H bond, which is more stable than C—C or C—O bonds.

Dimensional Instability of as-deposited Films: One of the important requirements for the dielectric film is to achieve good adhesion to the barrier layer, etch stop layer and the cap layer. Although not wanting to be bound by theory, adhesion strength can be examined by examining chemical and physical contributors. For example, good physical or mechanical adhesion calls for good mechanical interlocks with larger contacting surfaces. In addition, to achieve good mechanical interlocking, the dimensional stability of the interlocking faces has to be stable in view of their relative dimensional expansion under temperature incursion. Since all inorganic layers used in IC fabrications have lower Coefficient of Thermal Expansion ("CTE") than co-polymer dielectric, it is thus desirable to lower the CTE of the co-polymer dielectric by either increase their cross-linking density or increase their crystallinity.

In the present invention, dimensional stability of an as-deposited film is achieved by: 1) controlling the deposition conditions, such as feed rate and substrate temperature to obtain a thermally more stable crystal form, and 2) post-annealing treatment of an as-deposited film to increase its crystallinity. The details for both the processing conditions and the post annealing methods are described below.

II. Methods for Making Dimensional Stable Films: Without proper processing conditions, high crystalline PPX-F containing films obtained through re-crystallization will fail when subjected to fabrication processes currently employed for making IC's. In the IC's that use electrically plated copper as a conductor, the required annealing temperature for the copper ranges from 300° C. for one hour to 350° C. for 30 minutes. Some integration processes also require a substrate temperature of 400° C. In addition, during packaging operations of the IC's, such as wire bonding or solder reflow, structural stability of the dielectric at temperatures as high as 300° to 350° C. is also required. Therefore, any useful PPX-F containing films needs to be chemical and dimensionally stable at temperatures up to 300° to 350° C., preferably 350° to 400° C. for at least 30 minutes.

DSC measurements, performed at a 10 to 15° C. per minute heating rate and under a nitrogen atmosphere, show a peak $T_g$ for PPX-F around 170° C. and an Alpha to Beta-1 irreversible crystal transformation temperature, ("ICT"), ranging from 200° to 290° C. with a peak temperature, $T_1$, around 280° C. In addition, there are also a Beta-1 to Beta-2 reversible crystal transformation temperature ("RCT"), ranging from 350 to 400° C. with a peak $T_2$ around 396° C. and a melting temperature, $T_m$, ranging from 495 to 512° C. with a peak $T_m$ around 500° C. For comparison, the corresponding $T_g$, $T_1$, $T_2$, and $T_m$ for PPX-N are respectively, 65°, 230°, 292° and 430° C. (Wunderlich, et al., J. Polym. Sci. Polym. Phys. Ed., Vol. 11 (1973) and Wunderlich, et al., J. Polym. Sci. Polym. Phys. Ed., Vol. 13 (1975)). The Alpha to Beta-1 crystal transformation occurring at $T_1$ is irreversible, while the Beta-1 to Beta-2 crystal transformation, at $T_2$, is reversible for both PPX-N and PPX-F. When a crystalline PPX-N or PPX-F film is exposed to temperatures approaching its $T_1$, co-polymer chains in its Alpha crystalline phase will start to reorganize and transform into a more thermally stable Beta-1 crystal phase. Once this happens, the film will never show its Alpha phase again, even by cooling the film below its $T_1$. However, if a PPX-N or PPX-F film is cooled slowly from at or above its $T_2$ to a temperature below its $T_2$, the less dimensionally stable Beta-1 crystal phase will reform.

One way to maximize the dimensional stability of the PPX-F containing films is to trap the co-polymer chains in their most thermally stable form, the Beta-2 crystal phase, if the film is to be used or exposed to temperatures approaching $T_2$. Then, if the film is exposed to temperatures approaching or surpassing its $T_2$, crystal transformation cannot occur, because the film is already in its Beta-2 form. Eliminating this phase transformation ensures the dimensional stability of the film. Although not wanting to be bound by theory, when the film is in its Beta-2 crystal phase, its dimensional stability is still assured even at temperatures approaching 50 to 60° C. below its $T_m$. A highly crystalline (greater than 50% crystallinity) PPX-F containing films in a Beta-2 crystal phase can be dimensionally stable up to 450° C. for at least 30 minutes, limited only by its chemical stability.

A co-polymer film that exhibit a reversible crystal transformation temperature, $T_2$, and a crystal melting temperature, $T_m$ can be obtained by optimizing the feed rate and substrate temperature during film deposition. By controlling the feed rate and substrate temperatures, semicrystalline films consisting of either Alpha or Beta phase crystals have been prepared (Wunderlich, et al., J. Polym. Sci. Polym. Phys. Ed., Vol. 11 (1973) and Wunderlich, et al., J. Polym. Sci. Polym. Phys. Ed., Vol. 13 (1975)). When the substrate temperature is lower than the melting temperature of its intermediate diradical, $T_{dm}$, and when the feed rate is low (e.g. less than 0.07 g/minute), the polymerization of crystalline diradicals can result in PPX-N films that are predominantly in the Beta crystal phase and have high crystallinity. Conversely, when the substrate temperature is higher than the $T_{dm}$, polymerization of liquid diradicals and subsequent crystallization of polymers often results in PPX-N films that are in the Alpha crystal phase and have low crystallinity.

The above film on wafer is generally referred as an "as-deposited film". Before it is removed from the deposition system and when it is still under the vacuum condition, the as-deposited film needs to be further stabilized in order to achieve its chemical and dimensional stability useful for this invention.

Accordingly, a stabilized film can be obtained by annealing the as-deposited film to a temperature approaching to or above its $T_2$ and under the presence of hydrogen and then quickly quenching the films to at least 30° to 60° C. below their $T_2$. For instance, a PPX-F containing films that is predominantly in the Beta-2 crystal phase can be obtained by heating the film to 450° C. for 5 minutes, then quenching the film to 330° C. at a cooling rate of 50° C./minute. When the post annealing was performed under 3 to 20% hydrogen conditions, the resulting films also exhibited very low leakage current comparing to the as-deposited film and a annealed film that was obtained under vacuum conditions.

Actual co-polymer chain motions for solid state transition or phase transformation can start from 30° to 60° C. below the corresponding $T_g$, $T_1$, $T_2$ and $T_m$ depending on the history of the films, degree of crystallinity, perfection of crystals, or the existence of various low molecular weight material in the crystalline phase (Wunderlich, Macromolecular Physics, Vol. 1–2 (1976). In fact, the Beta-1 to Beta-2 transition can start at temperatures ranging from 40 to 50° C. below $T_2$, (about 396° C.) for PPX-F containing films. Therefore, by exposing a deposited PPX-F containing film to 350° C. for one hour, the quenched PPX-F containing films also exhibited a high content of Beta-2 phase crystallinity. DSC can verify the presence of Beta-2 crystal. When a PPX-F film containing a high percentage of Beta-2 phase crystals was scanned by DSC from 25 to 510° C. under a nitrogen atmosphere, only $T_m$ was observed and not $T_1$ or $T_2$.

The maximum temperature, $T_{max}$, which is encountered during the manufacturing of IC's, will undoubtedly be lowered over time due to technological advancements. Improvements in copper plating chemistries and the perfection of the resulting copper films will lower the required annealing temperatures. In addition, physical vapor deposition temperatures for barrier layers or cap layers could be reduced to temperatures below 400° C. Once this occurs, the maximum processing temperature, $T_{max}$, can be lowered to temperatures below 350° C., possibly as low as 325° to 300° C. In that case, the annealing of PPX-F containing films can be performed at temperatures 30° to 50° C. below $T_2$ (396° C. for PPX-F) or as low as temperatures 10° to 20° C. above $T_1$ (280° C. for PPX-F). However, the annealing should be done at a temperature equal to or higher than the $T_{max}$ for 1 to 60 minutes and preferably for 3 to 5 minutes.

Note that all the above post annealing should be conducted before an as-deposited film is removed from the deposition systems and is conducted in the presence of hydrogen. Preferably, the reductive annealing is conducted not inside the deposition chamber but inside a post treatment chamber. The reductive annealing is conducted under an atmosphere consisting of 0.1 to 100 mtorr, preferably 3 to 6% of H in argon and at high temperatures conditions described above.

III. Methods for Stabilizing Films after Plasma Etching: During fabrication of future IC's, a stabilized film obtained from the above will subject to further process as follows: First, a photoresist is spun onto a substrate and patterned using a photo mask and UV irradiation. After removal of unexposed photoresist, a via in the dielectric layer is formed by plasma etching of the dielectric that is not protected by the photoresist. A thin layer (100 to 200 Å) of barrier metal such as Ta is then deposited using a physical vapor deposition ("PVD") method. Optionally, a cap-layer is deposited over the dielectric before coating of photoresist and photolithographic pattering of the dielectric. The cap-layer is used to protect the dielectric from mechnical damage during CMP.

The low k films that consist primarily of C, H and F and single bonds of $sp^2C$—F and HC-$sp^3C$—F types can utilize oxidative plasma to achieve high etching rate vs. that of photoresist. Under treatment under 0.02 W/cm² to 2.0 W/cm², preferably 0.04 W/cm² to 1.0 W/cm² of discharge power and under 20 to 2000, preferably 50 to 500 mTorrs of oxygen pressure, an etching rate ranging from 500 to 5000 Å/minute can be obtained. However, after more than few Angstroms of co-polymers were removed from the film surface, the composition of the resulting surface became highly oxidized. The freshly etched co-polymer surfaces are NOT suitable for fabrication of IC's, because they consist of thermally unstable oxygenated carbon groups, such as —CX—O, —XC═O, —CX—O—O—X and —(C═O)—OX bonds (X=H or F). These oxygenated carbon bonds will decompose at temperatures above 200 to 350° C. In addition, these types of oxidized surfaces tend to adsorb moisture and form hydrogen bonded water on their surfaces. Thus, if a barrier metal, cap layer or etch stop layer is deposited over the oxidative plasma treated surface, loss of adhesion can easily happen after the coating process or during subsequent processes.

In addition, dry etching using nitrogen plasma has also performed patterning of the dielectric film of this invention. For instance, nitrogen plasma patterning can be done using 30W of plasma power under 900 mTorrs of pressure. The resultant film surfaces were found unsuitable for obtaining good adhesion. We suspect that some nitrogen were chemically reacted with the C—X (X=H or F) of the dielectric surfaces and converted to unstable —C—N or polar —C═N— bonds both are desirable for IC fabrication applications.

A method to re-stabilize the reactive plasma etched treated co-polymer surfaces that is obtained from the oxygen or nitrogen plasma etching, for further coating includes reductive annealing the surfaces under hydrogen atmosphere at high temperatures. Alternatively, by treating the oxidized surfaces first using non-reactive plasma then followed with a reductive annealing at high temperatures. The non-reactive plasma for instance can be conducted under the presence of argon gas. The non-reactive plasma is believed, in addition to remove some of the oxygenated or nitrogen-reacted carbon groups on surfaces, also to roughen these surfaces for better mechanical adhesion during the subsequent coating. The reductive annealing under high temperature is primarily used to reduce the $sp^2C$—Y and HC-$sp^3C$—Y (Y═O or N) groups back to $sp^2C$—Z and HC-$sp^3C_\alpha$—X. Herein, Z and X is F, or preferably H. Note that the above methods will result in thermally stable $sp^2C$—Z and HC-$sp^3C_\alpha$—X bonds (Z and X=H or F) that are thermally stable for fabrications of future IC's.

Note that the above re-stabilization methods are not useful if the original low k films consist of other unstable chemical bonds, such as $sp^3C$—X bonds (X=H or F). These polymers consist of regular tetrahedron $sp^3C$—X bonds, such as —$CX_3$ and —$CX_2$— bonds (X=H or F) that its carbon is not an Alpha carbon to an aromatic moiety. These $sp^3C$—X bonds-containing polymers are not stable enough for fabrications of future IC's that require a minimum thermal stability at temperatures of 350° C. or higher for 30 minutes or longer. Therefore, even their after-oxidative-plasma-etched surfaces are treated with the methods described for this invention, the thermal stability of their resulting polymers will NOT be improved beyond the thermal stability of the original polymers, thus will still not useful for fabrication of future IC's.

The reductive annealing can be conducted under an atmosphere of 1 to 30%, preferably 3 to 10% of hydrogen in argon or other noble, gases and at 410 to 450° C. for 2 to 60, preferably from 3 to 10 minutes. The non-reactive plasma treatment can be conducted under treatment under 0.01 W/cm² to 1.0 W/cm², preferably 0.04 W/cm² to 0.4 W/cm² of discharge power and under 20 to 2000, preferably 50 to 500 mTorrs of argon pressure.

Alternatively, the dry etching by plasma partnering of a co-polymer film can be conducted in the presence of an reductive gas composition, for instance, from 20 to 2000, preferably 100 to 1000 mTorrs of 3 to 10% of hydrogen in argon or other noble gases and under 0.01 W/cm² to 1.0 W/cm², preferably 0.04 W/cm² to 0.4 W/cm² of discharge power.

(IV). Experiments and Results: The following are offered by way of example, and are not intended to limit the scope of the invention in any manner.

Experiment 1: Deposition PPX-F containing films was performed using a system that consisted of a quartz reactor with porous SiC inserts that were heated to a temperature of about 580° C. by an infrared heater. The first co-precursor is of structural formula (VIII):

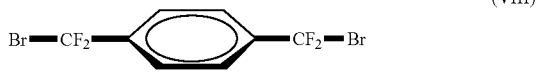

(VIII)

and the second co-precursor is of structural formula (XIV):

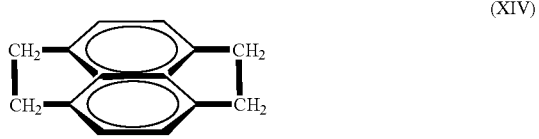

(XIV)

The first co-precursor (VIII) was heated in a sample holder at 65° C. to achieve a feed rate of at least 0.1 mMol/minute and transported to the reactor under a system vacuum of about 20 mTorrs. The second co-precursor (XIV) was heated in a separate sample holder at 120° C. to achieve a feed rate of at least 0.01 mMol/minute and transported to the same reactor under a system vacuum of about 0.01 mTorrs. The resulting mixture of co-precursors or diradical intermediates were transported to a 200-mm wafer that was kept at −35° C. using an electrical static chuck ("ESC"). The film thickness was about 3483 Å. ("Low $W^c$ $B_2$").

Experiment 1A: The resulting film from the Experiment 1 was analyzed using X-ray diffraction ("XRD"). The film has a diffraction angle, 2θ at 19.2 degree with relative peak intensity of 520, indicative of Beta 2 crystals in the film that has low crystallinity ("$W^c$"). After the film was annealed on hot plate at 350° C. for 10 minutes, only peak intensity changes to about 800. After the film was annealed on hot plate at 390° C. for 10 minutes, its peak intensity changes to about 870. After the film was annealed on hot plate at 405° C. for 10 minutes, its peak intensity changes to about 1000. After the film was annealed on hot plate at 405° C. for 60 minutes and slowly cooled to 25° C., its diffraction angle, 2θ shifted to 20.3 degree with a relative peak intensity of 6000, indicative of Beta 1 crystals in the film that has very high crystallinity.

Experiment 1B: The film obtained from the Experiment 1 was annealed on hot plate at 410° C. for 30 minutes and slowly cooled to 25° C., its diffraction angle, 2θ shifted to 20.3 degree with a relative peak intensity of 6000, indicative of Beta 1 crystals in the film that has high crystallinity.

Experiment 1C: The film obtained from Experiment 1 was annealed on hot plate at 405° C. for 60 minutes and slowly cooled to 25° C., the XRD showed it consisted of Beta 1 crystal with high crystallinity. The film on silicon wafer was coated with a 200 Å of Ta using PVD process. The sample was annealed at 350° C. for 30 minutes. The resulting sample showed no breakage of Ta. Rutherford Backscattering Spectroscopy ("RBS") analysis of the profile showed Ta did not diffused into polymer, and the organic elements did not diffused inside the Ta.

Experiment 1D: The film obtained from the Experiment 1 was annealed on hot plate at 300° C. for 30 minutes, only peak intensity changes to about 500 ($B_2$). After the film was annealed on hot plate at 450° C. for 30 minutes and quickly quenched to room temperature, the film still showed a diffraction angle, 2θ at 19.2 degree with a peak intensity changes to about 3000, indicative of Beta 2 crystal in the film with high crystallinity. The film on silicon wafer was coated with a 200 Å of Ta using PVD process. The sample was annealed at 350° C. for 30 minutes. The resulting sample showed no breakage of Ta. RBS (Rutherford Backscattering Spectroscopy) analysis of the profile showed no Ta diffused into polymer, nor organic elements diffused inside the Ta.

In summary, the above experiments indicated that high crystalline 1 and Beta 2 are stable, when Ta is used as barrier layer and the annealing condition is no more than 350° C. for 30 minutes. However, if a prolong annealing time or a higher temperature is required, it is preferred to use a PPX-F film that consisted of highly crystalline Beta 2 crystal phase, because it is more dimensionally stable than the Beta 1 crystals. The above as-deposited film has a dielectric constant of 2.3 whereas the post annealed films obtained from Experiments 1 B to 1D have dielectric constant ranges from 2.0 to 1.98. The annealed films are porous films consisting of about 8 to 10% porosity.

Experiment 2: The film obtained from Experiment 1 (Low $W^c$ $B_2$) was heated to 350° C. at a 15° C. /minute heating rate, held isothermally at about 350° C. for 30 minutes under $10^{-7}$ vacuum, then quenched at 60° C./minute to room temperature. The resulting film is about 3472 Å. (Med $W^c$ $B_2$)

Experiment 3: The film obtained from Experiment 1 (Low $W^c$ $B_2$) was heated to 410° C. at a 15° C. /minute heating rate, held isothermally at about 410° C. for 30 minutes under $10^{-7}$ vacuum, then quenched at 60° C./minute to room temperature. The resulting film is about 3395 Å. (Hi $W^c$ $B_2$)

Experiment 4: The film obtained from Experiment 1 (Low $W^c$ $B_2$) was heated to 400° C. at a 15° C. /minute heating rate, held isothermally at about 400° C. for 60 minutes nitrogen atmosphere, then slowly cooled to room temperature (Hi $W^c$ $B_1$).

Experiment 5: The film obtained from Experiment 1 (Low $W^c$ $B_2$) was coated with a 250 Å of Ta using PVD process. Peel test using a 3M Scotch® tape showed adhesion failure at Si wafer interface. After the sample was annealed at 350° C. for 30 minutes under $10^{-7}$ vacuum, the sample Ta was heavily corroded and cracked with dielectric film.

Experiment 6: The film obtained from Experiment 2 (Med $W^c$ $B_2$) was coated with a 250 Å of Ta using PVD process. Peel test using a 3M Scotch® tape showed no adhesion failure. However, after the sample was annealed at 350° C. for 30 under $10^{-7}$ vacuum, the sample failed at dielectric and Si-wafer interface when subjected to peeling test using 3M Scotch® tape. In addition, Ta showed slightly cracking.

Experiment 7: The film obtained from Experiment 3 (Hi $W^c$ $B_2$) was coated with a 250 Å of Ta using PVD process. Peel test using a 3M Scotch® tape showed no adhesion failure. However, after the sample was annealed at 350° C. for 30 under $10^{-7}$ vacuum, the sample failed at dielectric and Si-wafer interface when subjected to peeling test using 3M Scotch® tape. In addition, Ta showed slightly cracking.

Experiment 8a: The film obtained from Experiment 4 (Hi $W^c$ $B_1$) was coated with a 250 Å of Ta using PVD process. Peel test using a 3M Scotch® tape showed no adhesion failure. After the sample was annealed at 350° C. for 30 minutes under $10^{-7}$ vacuum, Ta showed slightly sign of corrosions. When subjected to peeling test using a 3M Scotch® tape, the sample showed no adhesion failure.

Experiment 8b: The film obtained from Experiment 4 (Hi-$W^c B_1$) was further heated to 410° C. at a 15° C./minute heating rate, held isothermally at about 410° C. for 30 minutes under $10^{-7}$ vacuum, then quenched at 60° C./minute to room temperature (Maxi-$W^c B_2$). The sample was coated with a 250 Å of Ta using PVD process. Peel test using a 3M Scotch® tape showed no adhesion failure. After the sample was annealed at 350° C. for 30 minutes under $10^{-7}$ vacuum, Ta showed no sign of corrosions. When subjected to peeling test using a 3M Scotch® tape, the sample showed no adhesion failure.

Experiment 9: The film obtained from Experiment 4 (Hi-$W^c B_1$) was etched at 50 Watts of power and under 50 mTorrs of oxygen plasma to remove 400 Å of co-polymer film. The film was then coated with a 250 Å of Ta using PVD process. The samples passed a peeling test using a 3M Scotch® tape. After the sample was annealed at 350° C. for 30 minutes under $10^{-7}$ vacuum, the Ta only showed spotty corrosions at the edge of test specimens. When subjected to peeling test using a 3M Scotch® tape, the sample peeled off 50% at low k and Ta interface.

Experiment 10: The film obtained from Experiment 4 (Hi-$W^c B_1$) was etched at 50 Watts of power and under 50 mTorrs of oxygen plasma to remove 400 Å of co-polymer. The film was annealed under $10^{-7}$ Torrs of vacuum and at 410° C. for 30 minutes and then quenched to room temperature (Maxi $W^c B_2$). The film was then coated with a 250 Å of Ta using PVD process. The samples passed a peeling test using a 3M Scotch® tape. After the sample was annealed at 350° C. for 30 minutes under $10^{-7}$ vacuum, Ta only showed spotty corrosions at the edge of test specimens. When subjected to peeling test using a 3M Scotch® tape, the sample peeled 10% at low k and Ta interface.

Experiment 11: The film obtained from Experiment 4 (Hi $W^c B_1$) was annealed under $10^{-7}$ Torrs of vacuum and at 410° C. for 30 minutes and then quenched to room temperature (Maxi $W^c B_2$). Then it was etched at 50 Watts of power and under 50 mTorrs of oxygen plasma to remove 400 Å of co-polymer films. The film was then coated with a 250 Å of Ta using PVD process. The samples passed a peeling test using a 3M Scotch® tape. After the sample was annealed at 350° C. for 30 minutes under $10^{-7}$ vacuum, Ta only showed spotty corrosions at the edge of test specimens. When subjected to peeling test using a 3M Scotch® tape, the sample failed adhesion at low k and Ta interface.

Experiment 12: The film obtained from Experiment 4 (Hi $W^c B_1$) was annealed under $10^{-7}$ Torrs of vacuum and at 410° C. for 30 minutes and then quenched to room temperature (Maxi $W^c B_2$). Then it was etched at 50 Watts of power and under 50 mTorrs of oxygen plasma to remove 400 Å of co-polymer film. The film was annealed under $10^{-7}$ Torrs of vacuum and at 410° C. for 30 minutes and quenched to 25° C. (Maxi $W^c B_2$). The film was then coated with a 250 Å of Ta using PVD process. The samples passed a peeling test using a 3M Scotch® tape. After the sample was annealed at 350° C. for 30 minutes under $10^{-7}$ vacuum, Ta only showed spotty corrosions at the edge of test specimens. When subjected to peeling test using a 3M Scotch® tape, the sample failed adhesion at low k and Ta interface.

Experiment 13: The film obtained from Experiment 4 (Hi $W^c B_1$) was annealed under $10^{-7}$ Torrs of vacuum and at 410° C. for 30 minutes and then quenched to room temperature (Maxi $W^c B_2$). Then it was etched at 50 Watts of power and under 50 mTorrs of oxygen plasma to remove 400 Å of co-polymer film. The film was annealed then under 3% $H_2$ in argon at 410° C. for 30 minutes (Maxi $W^c B_2$). The film was then coated with a 250 Å of Ta using PVD process. The sample was then annealed at 350° C. for 30 minutes under $10^{-7}$ vacuum. The sample failed adhesion at low k and Si-wafer interface when subjected to peeling test using a 3M Scotch® tape.

Experiment 14: The film obtained from Experiment 4 (Hi $W^c B_1$) was annealed under $10^{-7}$ Torrs of vacuum and at 410° C. for 30 minutes and then quenched to room temperature (Maxi $W^c B_2$). Then it was etched at 50 Watts of power and under 50 mTorrs of oxygen plasma to remove 400 Å of co-polymer film. The film then was treated at 30-Watts power with 900 mTorrs of $N_2$ plasma. The film was then coated with a 250 Å of Ta using PVD process. The sample was then annealed at 350° C. for 30 minutes under $10^{-7}$ vacuum. The sample failed adhesion at low k and Ta interface when subjected to peeling test using a 3M Scotch® tape.

Experiment 15: The film obtained from Experiment 4 (Hi $W^c B_1$) was annealed under $10^{-7}$ Torrs of vacuum and at 410° C. for 30 minutes and then quenched to room temperature (Maxi $W^c B_2$). Then it was etched at 50 Watts of power and under 50 mTorrs of oxygen plasma to remove 400 Å of co-polymer film. The film then was treated at 30 Watts of discharge power and 900 mTorrs of $N_2$ plasma. Then, the film was annealed under 3% $H_2$ in argon at 410° C. for 30 minutes and then quenched to room temperature (Maxi $W^c B_2$). The film was then coated with a 250 Å of Ta using PVD process. The sample was then annealed at 350° C. for 30 minutes under $10^{-7}$ vacuum. The sample failed adhesion at low k and Si-wafer interface when subjected to peeling test using a 3M Scotch® tape.

Experiment 16: The film obtained from Experiment 4 (Hi $W^c B_1$) was etched at 50 Watts of discharge power and under 50 mTorrs of oxygen plasma to remove 400 Å of co-polymer film. The film then was treated at 30 Watts of discharge power and 900 mTorrs of $N_2$ plasma. The film was then coated with a 250 Å of Ta using PVD process. The sample was then annealed at 350° C. for 30 minutes under $10^{-7}$ vacuum. The sample partially peeled at low k and Ta interface when subjected to peeling test using a 3M Scotch® tape.

Experiment 17: The film obtained from Experiment 4 (Hi $W^c B_1$) was etched at 50 Watts of power and under 50 mTorrs of oxygen plasma to remove 400 Å of co-polymer film. The film was annealed under 3% $H_2$ in argon at 410° C. for 30 minutes and then quenched to room temperature (Maxi $W^c B_2$). The film was then coated with a 250 Å of Ta using PVD process. The sample was then annealed at 350° C. for 30 minutes under $10^{-7}$ vacuum. The sample was partially peeled at low k and Ta interface when subjected to peeling test using a 3M Scotch® tape.

Experiment 18: The film obtained from Experiment 4 (Hi $W^c B_1$) was etched at 50 Watts of power and under 50 mTorrs of oxygen plasma to remove 400 Å of co-polymer film. The film then was treated at 30 Watts of discharge power and 900 mTorrs of $N_2$ plasma. The film was then annealed under 3% $H_2$ in argon at 410° C. for 30 minutes. The film was then coated with a 250 Å of Ta using PVD process. The sample was then annealed at 350° C. for 30 minutes under $10^{-7}$ vacuum. The sample showed NO peeling when subjected to peeling test using a 3M Scotch® tape.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications, and variations as falling within the true scope and spirit of the present invention.

REFERENCES CITED

The following U.S. Patent documents and publications are incorporated by reference herein.

U.S. PATENT DOCUMENTS

U.S. Pat. No. 3,268,599 issued on Aug. 23, 1966, entitled "Process for the Preparation of cyclo(αPerfluro-di-p-xylylenes)", with Chow, et al. listed as inventors.

U.S. Pat. No. 3,274,267 issued on Sep. 20, 1966, entitled "Cyclic α-Perfluoro-di-p-Xylylenes," with Chow listed as inventors.

U.S. Pat. No. 3,342,754 issued on Sep. 20, 1967, entitled "Para-Xylylene Polymer" with Gorham listed as inventors.

U.S. Pat. No. 5,268,202 issued on Dec. 7, 1993, entitled "Vapor deposition of parylene-F using 1,4-bis (trifluoromethyl) benzene," with You, et al., listed as inventors.

U.S. Pat. No. 6,140,456 issued on Oct. 31, 2000, entitled "Chemicals and processes for making fluorinated poly (para-xylylenes)" with Lee, et al., listed as inventors.

U.S. patent application Ser. No. 09/795,217 filed on Feb. 26, 2001, entitled "Integration of Low $\epsilon$ Thin films and Ta into Cu Dual Damascene," with Lee, et al. listed as inventors.

U.S. patent application Ser. No. 09/925,712 filed on Aug. 9, 2001, entitled "Stabilized Polymer Film and its Manufacture," with Lee, et al., listed as inventors.

U.S. patent application Ser. No. 10/028,198 filed on Dec. 19, 2001, entitled "Dielectric Thin Films from Fluorinated Precursors," with Lee et al,. listed as inventors.

U.S. patent application Ser. No. 10/029,373 filed on Dec. 19, 2001, entitled "Dielectric Thin Films from Fluorinated Benzocyclobutane Precursors," with Lee, et al. listed as inventors.

U.S. patent application Ser. No. 10/116,724, filed on Apr. 4, 2002, and entitled "Chemically and Electrically stabilized Polymer Films" with Lee, et al., listed as inventors.

U.S. patent application Ser. No. 10/115,879 filed on Apr. 4, 2002, and entitled "UV Reactor for Transport polymerization" with Lee, et al., listed as inventors.

U.S. patent application Ser. No. 10/125,626 filed on Apr. 17, 2002, and entitled "Multi-stage-heating Thermal reactor for transport Polymerization" with Lee, et al., listed as inventors.

U.S. patent application Ser. No. 10/126,919 filed on Apr. 19, 2002, entitled "Process Modules for transport polymerization of low $\epsilon$ thin films" with Lee, et al., listed as inventors.

OTHER REFERENCES

Brun A. E. 100 nm: The Undiscovered Country, Semiconductor International, p79, February 2000.

Chung Lee, "Transport Polymerization of Gaseous Intermediates and Co-polymerCrystals Growth" J. Macromol. Sci-Rev. Macromol. Chem., C16 (1), 79–127 (1977–78), pp79–127).

Geissman T. A. Principles of Organic Chemistry, 3rd edition, W. H. Freeman & Company, p275

Kudo, et al., Proc. 3d Int. DUMIC Conference, 85–92 1997

LaBelle, et al., Proc. 3d Int. DUMIC Conference, 98–105 1997

Lee, J., et al. Macromol Sci-Rev. Macromol. Chem., C16(1) 1977–78.

Lu et al, J.Mater.Res.Vol,14(1), , p246–250, 1999; Plano et al, MRS Symp.Proc.Vol.476, p213–218, 1998

Selbrede, et al., Characterization of Parylene-N Thin Films for Low Dielectric Constant VLSI Applications, Feb. 10–11, 1997, DUMIC Conferece, 1997 ISMIC—222D/97/0034, 121–124.

Wang, et al., Parylene-N Thermal Stability Increase by oxygen Reduction-Low Substrate Temperature Deposition, Preannealing, and PETEOS Encapsulation, Feb. 10–11, 1997, DUMIC Conference, 1997 ISMIC—222D/97/0034, 125–128.

Wary, et al., Co-polymerDeveloped to be Interlayer Dielectric, Semi-Conductor International, 211–216, June 1996.

Wunderlich et al, Jour. Polymer. Sci. Polymer. Phys. Ed., Vol. 11, (1973), pp 2403–2411; ibid, Vol. 13, (1975), pp1925–1938.

Wunderlich, et al., J. Polym. Sci. Polym. Phys. Ed., Vol. 13 1975.

Wunderlich, Macromolecular Physics, vol. 1–2, 1976

What is claimed is:

1. A co-polymer dielectric thin film prepared on a substrate by transport co-polymerization ("TCP") of a first reactive intermediate with a second reactive intermediate, wherein the first reactive intermediate is formed from a first co-precursor, and wherein the second reactive intermediate is formed from a second co-precursor, the co-polymer dielectric thin film comprising:

a co-Poly(Para-Xylylene) ("Co-PPX") having repeating-units selected from the group consisting of $((-CH_2-C_6H_4-H_2C-)_a(-CF_2-C_6H_4-F_2C-)_b)_n^\infty$, $((-CF_2-C_6F_4-F_2C-)_a(-CH_2C_6F_4-H_2C-)_b)_n^\infty$, and $((-CF_2-C_6H_2F_2-C-)_a(-CF_2-C_6F_4-H_2C-)_b)_n^\infty$, wherein, "a" is an integer that ranges from 3 to 10; "b" is an integer that ranges from 20 to 100; and $n^{\circ\circ}$ is an integer of at least 10;

wherein the TCP is performed under a vacuum with a low system-leakage-rate, an inert atmosphere, or both; and wherein the film is at least semicrystalline.

2. The co-polymer dielectric thin film of claim 1, wherein a major composition of the co-PPX is a PPX-F, having a major repeating unit comprising $(-CF_2-C_6H_4-F_2C-)$.

3. The co-polymer dielectric thin film of claim 2, wherein the PPX-F content is within the range of 65 to 95 molar %.

4. The co-polymer dielectric thin film of claim 2, wherein the PPX-F content is within the range of 75 to 90 molar %.

5. The co-polymer dielectric thin film of claim 1, wherein a minor composition of the co-PPX is a PPX-N and its derivatives, having a minor repeating unit comprising $(-CH_2-C_6H_4-H_2C-)$.

6. The co-polymer dielectric thin film of claim 1, wherein the film is transparent.

7. A dielectric film prepared on a substrate by transport polymerization of at least two reactive intermediates, wherein the dielectric film comprises a copolymer having at least two repeating units, wherein a first repeating unit is a partially-fluorinated poly(paraxylylene), and wherein a second repeating unit has a general formula of $\{Z'\}_m$—Ar—$(CX'X'')_n$, wherein n is an integer equal to or greater than 2, and wherein in m+n is no greater than a number of sp$^2$ substitution sites on Ar, wherein each of X' and X" is a hydrogen, a fluorine, an alkyl group, a fluorinated alkyl group, a phenyl group, or a fluorinated phenyl group, wherein each Z' is a hydrogen or a fluorine, wherein Ar is an aromatic moiety; and wherein the film is porous.

8. The dielectric film of claim film of claim 7, wherein the second repeating unit is an unfluorinated, partially fluorinated, or fully fluorinated paraxylylene moiety.

9. The dielectric film of claim 7, wherein the film is a copolymer of —$CF_2C_6H_4CF_2$— and —$CH_2C_6H_4CH_2$— monomers.

10. The dielectric film of claim 9, wherein a molar percentage of PPX-F in the copolymer is equal to or greater than 50%.

11. A dielectric film prepared on a substrate by transport polymerization of at least two reactive intermediates, wherein the dielectric film comprises a copolymer having at least two repeating units, wherein a first repeating unit is a partially-fluorinated poly(paraxylylene), and wherein a second repeating unit has a general formula of Ar—$(CX'X")_n$, wherein n is equal to or greater than 2, wherein each of X' and X" is a hydrogen, a fluorine, an alkyl group, a fluorinated alkyl group, a phenyl group, or a fluorinated phenyl group, wherein Ar is an aromatic moiety or a fluorine-substituted aromatic moiety, and wherein the dielectric film is porous.

* * * * *